United States Patent
Droege et al.

(10) Patent No.: US 10,079,489 B2
(45) Date of Patent: *Sep. 18, 2018

(54) POWER MANAGEMENT IN MULTI-DIE ASSEMBLIES

(71) Applicant: Intel Corporation, Santa Clara, CA (US)

(72) Inventors: Guido Droege, Braunschweig (DE); Andre Schaefer, Braunschweig (DE); Uwe Zillmann, Braunschweig (DE)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/206,999

(22) Filed: Jul. 11, 2016

(65) Prior Publication Data

US 2017/0011779 A1     Jan. 12, 2017

Related U.S. Application Data

(63) Continuation of application No. 13/927,227, filed on Jun. 26, 2013, now Pat. No. 9,391,453.

(51) Int. Cl.
    *H02J 1/00*          (2006.01)
    *G11C 7/00*         (2006.01)
    (Continued)

(52) U.S. Cl.
    CPC .................. *H02J 1/00* (2013.01); *G11C 5/14* (2013.01); *G11C 5/147* (2013.01); *G11C 7/00* (2013.01);
    (Continued)

(58) Field of Classification Search
    CPC .. G11C 5/14; G11C 7/00; G05F 1/618; H01L 2924/30107; H01L 2924/14; H01L 23/645;
    (Continued)

(56) References Cited

U.S. PATENT DOCUMENTS

| 5,900,764 A | 5/1999 | Imam et al. |
| 2003/0227280 A1 | 12/2003 | Vinciarelli |

(Continued)

FOREIGN PATENT DOCUMENTS

| JP | 2011181914 A | 9/2011 |
| KR | 20030027038 | 4/2003 |

(Continued)

OTHER PUBLICATIONS

International Preliminary Report on Patentability, PCT/US2014/042830, dated Jan. 7, 2016, 5 pages.

(Continued)

*Primary Examiner* — Ajay Ojha

(74) *Attorney, Agent, or Firm* — Compass IP Law PC

(57) ABSTRACT

An apparatus such as heterogeneous device includes at least a first die and a second die. The apparatus further includes a first inductive element, a second inductive element, and switch control circuitry. The switch control circuitry is disposed in the first die. The switch control circuitry controls current through the first inductive element to produce a first voltage. The first voltage powers the first die. The second inductive element is coupled to the first inductive element. The second inductive element produces a second voltage to power the second die. The first die and second die can be fabricated in accordance with different technologies and in which the first die and second die withstand different maximum voltages. A magnitude of the first voltage can be greater than a magnitude of the second voltage.

19 Claims, 10 Drawing Sheets

(51) Int. Cl.
  *H02M 1/088* (2006.01)
  *G11C 5/14* (2006.01)
  *G11C 5/02* (2006.01)
  *G05F 1/618* (2006.01)
(52) U.S. Cl.
  CPC .............. *H02M 1/088* (2013.01); *G05F 1/618* (2013.01); *G11C 5/025* (2013.01)
(58) Field of Classification Search
  CPC .... H02J 1/00; H02J 5/005; H02J 7/025; H02J 7/045; H03H 9/02409; H03H 7/38; H02M 1/088
  See application file for complete search history.

(56) References Cited

U.S. PATENT DOCUMENTS

| | | |
|---|---|---|
| 2004/0257836 A1 | 12/2004 | Porter et al. |
| 2009/0161401 A1* | 6/2009 | Bilger .................... G11C 5/02 365/51 |
| 2010/0165585 A1 | 7/2010 | Lin et al. |
| 2011/0109382 A1 | 5/2011 | Jin et al. |
| 2011/0121811 A1 | 5/2011 | Dennard et al. |
| 2011/0260781 A1 | 10/2011 | Takeuchi et al. |
| 2012/0140531 A1 | 6/2012 | Lin |
| 2012/0273893 A1 | 11/2012 | Hashimoto et al. |
| 2013/0279276 A1 | 10/2013 | Schaefer |
| 2013/0335059 A1 | 12/2013 | Saraswat et al. |
| 2014/0119059 A1 | 5/2014 | Mao |
| 2014/0152376 A1 | 6/2014 | Rofougaran |

FOREIGN PATENT DOCUMENTS

| | | |
|---|---|---|
| RU | 2398279 C2 | 8/2010 |
| WO | 0217469 | 2/2002 |
| WO | 2012125237 A2 | 9/2012 |

OTHER PUBLICATIONS

International Search Report and Written Opinion for PCT Patent Application No. PCT/US2014/042830, dated Oct. 8, 2014, 7 pages.
Extended European Search Report for Patent Application No. 14818632.3, dated Feb. 16, 2017, 8 pages.
Organized Translation of "Notice of Reasons for Rejection" for Japanese Patent Application No. 2016-521526, dated Feb. 7, 2017, 1 page.
English Translation of the Notice of Preliminary Rejection, Application No. 10-2015-7031496, dated Oct. 17, 2016, 4 pages.
Summary of KR Office Action, Patent Application No. 10-2015-7031496, dated Aug. 18, 2017, 4 pages.
English Translation of Russian Office Action, Patent Application No. 2015150798, dated Apr. 27, 2017, 2 pages.
English Translation of Search Report of Patent Application No. 2015150798, dated Apr. 27, 2017, 26 pages.
English Translation of State Intellectual Property Office, P.R. China, Office Action, Patent Application No. 201480030419.X, dated May 12, 2017, 16 pages.
English Translation of the Notice of Final Rejection, Application No. 10-2015-7031496, dated Apr. 17, 2017, 3 pages.
Notice of Allowance for U.S. Appl. No. 13/927,227, dated Mar. 14, 2016,13 pages.
Notice of Allowance for U.S. Appl. No. 13/927,227, dated Nov. 13, 2015,11 pages.
Office Action for U.S. Appl. No. 13/927,227, dated Jun. 2, 2015, 18 pages.
Chinese and English Translation of P.R. China State Intellectual Property Office Second Office Action for Patent Application No. 201480030419.X, dated Jan. 25, 2018, 16 pages.

* cited by examiner

POWER MANAGEMENT IN MULTI-DIE ASSEMBLIES

RELATED APPLICATIONS

This application is a continuation of earlier filed U.S. patent application Ser. No. 13/927,227 entitled "POWER MANAGEMENT IN MULTI-DIE ASSEMBLIES," filed on Jun. 26, 2013, the entire teachings of which are incorporated herein by reference.

TECHNICAL FIELD

Embodiments of the present disclosure relate generally to power management in multi-die assemblies.

BACKGROUND

In order to save space on a respective host substrate, multiple integrated circuits or dies may be combined to produce a single multi-die assembly by vertically stacking the dies on top of each other. In such an instance, a voltage received from the host substrate typically powers each die in the multi-die assembly.

In certain instances, the magnitude of voltage required to power each die in a stack may vary, in which case, the host substrate may provide multiple different voltages to power the multi-die assembly. External generation of the voltages on the host substrate may be undesirable because it requires that the board designer provide an external voltage regulator with respect to the multi-die assembly, increasing platform costs and complexity. In other words, external circuitry with respect to the multi-die assembly can be used to generate appropriate voltages to power the different dies in the multi-die assembly.

As an alternative to requiring external generation of the multiple voltages, conventional dies can be configured to include charge pump circuitry to convert a single received voltage into multiple different supply voltages. Via connectivity in the multi-die assembly, the internally generated voltages are then used to power the different dies in the multi-die assembly. Use of one or more charge pumps in a multi-die assembly is undesirable because they are typically inefficient and thus waste power.

DESCRIPTION OF THE EMBODIMENTS

Figure 1:
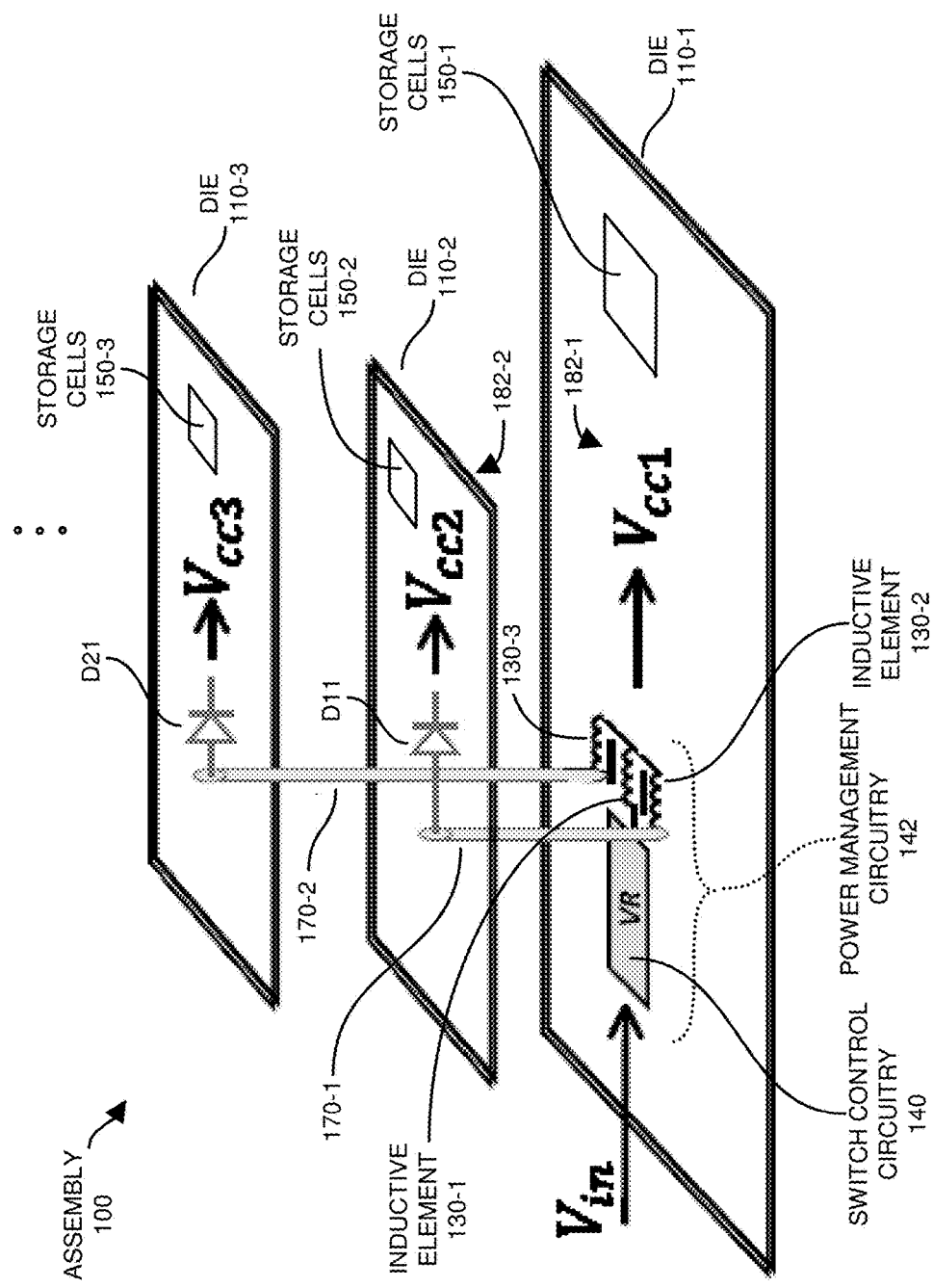
FIG. 1 is an example three-dimensional diagram illustrating an assembly including a stack of dies according to embodiments herein.

There has been a push towards fabrication of multi-die assemblies requiring multiple different power rails. Such a push is challenging because circuitry on one die in the multi-die assembly may not be able to withstand exposure to a voltage that is required by another die in the multi-die assembly. For example, the multi-die assembly can include a stack of DRAM (Dynamic Random Access Memory) in which multiple memory dies (fabricated in accordance with different technology) are stacked on top of each other. Circuitry such as control logic on one die in the multi-die assembly may be able to tolerate exposure to a high voltage such as VPP (i.e., a supply voltage) required by another die (such as a memory die) in the multi-die assembly to perform certain memory management operations.

One embodiment herein including power management circuitry disposed in a heterogeneous multi-die assembly (e.g., a memory stack, planar memory circuit, sensor circuitry, radio frequency or other high power technologies, etc.). A heterogeneous assembly can include multiple types of dies. For example, a first die in the assembly can be fabricated in accordance with a first technology, a second die can be fabricated in accordance with a second technology, and so on. Power management circuitry disposed in the assembly enables generation of one or more higher voltages for use in the heterogeneous assembly.

Each die in the heterogeneous multi-die assembly can be fabricated in accordance with the same or different technologies. For example, one or more dies in a stack can be fabricated in accordance with memory technologies including: SDRAM (Synchronous Dynamic Random Access Memory), DRAM (Dynamic Random Access Memory), SRAM (Static Random Access Memory), MRAM (Magnetoresistive random-access memory), EPROM (Erasable Programmable Read Only Memory), Flash, PCM (Phase Change Memory), etc. For automotive sensor applications, one or more dies in the stack can be fabricated in accordance with Smart power technology. One or more dies in a stack can be fabricated using different fabricated in accordance with different technologies such as CMOS (Complementary Metal Oxide Semiconductor), GaAS (Gallium Arsenide), Ge (Germanium), SiC (Silicon Carbide), etc.

All of the above fabrication technologies may have different voltage requirements and could be combined in a common stack.

Each of the different technologies may require application of a different voltage to power a respective die. For example, the first die in the heterogeneous die may require a first voltage VPP1 to perform a function such as data management (such as reads, erases, writes, etc.), the second die in the heterogeneous assembly may require a second VPP2 (such as a different or higher voltage than VPP1) to perform a function such as data management (such as reads, erases, writes, etc.), and so on.

Due to the fabrication technology used to fabricate a respective first die, the application of VPP2 (which is a higher voltage than VPP1) to any of the die components (such as transistors, diodes, etc.) in the first die may cause damage. Accordingly, it is a challenge to generate and/or convey a voltage VPP2 from the first die to the second die. One embodiment herein includes an apparatus such as heterogeneous assembly. As mentioned, the heterogeneous assembly (or device) can include a first die fabricated in accordance with a first fabrication technology; the heterogeneous assembly can include a second die fabricated in accordance with a second fabrication technology; and so on.

The heterogeneous assembly can further include switch control circuitry, a first inductive element, and a second inductive element. The switch control circuitry can be disposed in or on one or more of the dies.

In accordance with one embodiment, the first inductive element can be configured to receive an input voltage. The switch control circuitry controls current (such as current as provided by the input voltage) through the first inductive element to produce a first voltage. The first voltage can be greater in magnitude than the input voltage.

The first voltage powers the first die. The second inductive element is coupled to the first inductive element. The second inductive element produces a second voltage to power the second circuit. The second voltage powers the second die. Recall that the second die can require a higher voltage to perform respective operations in the second die. In one embodiment, a magnitude of the second voltage is substantially greater than a magnitude of the first voltage.

As mentioned, the first die and the second die can be fabricated in accordance with different technologies and in which the first die and second die withstand different maximum applied voltages. For example, die components in the first die may not be able to withstand the second voltage, which is required by the second die to perform certain operations.

Generation of different voltages using inductive elements as discussed herein reduces an amount of required area or volume of an assembly and corresponding power management circuitry. For example, the power management circuitry including first inductive element, second inductive element, and the switch control circuitry is disposed in the assembly.

Generation of different voltages using the power management circuitry as discussed herein also enables operation of heterogeneous circuits in an assembly. For example, as mentioned, the inductive elements and corresponding switching circuitry can be disposed within a respective heterogeneous device, thus reducing a size of external circuit board real estate and the number of power input pins needed on a respective assembly. Additionally, the generation of multiple voltages as discussed herein enables co-location and operation of heterogeneous circuits in a common device such as a memory stack including memory circuits fabricated in accordance with different technologies.

Now, more specifically, FIG. 1 is an example diagram illustrating a perspective view of an assembly such as a stack of dies according to embodiments herein.

As shown, assembly 100 includes two or more dies such as die 110-1, die 110-2, die 110-3, and so on. Assembly 100 can include any suitable number (e.g., 2, 3, 4, 5, . . . ) of dies (e.g., semiconductor chips, integrated circuits, etc.), each of which is fabricated in accordance with a same or different technology.

Each die in assembly 100 can be any suitable type of resource. For example, one or more dies in assembly 100 can be memory chips. In one embodiment, each of one or more dies in the assembly 100 can be a DRAM (Dynamic Random Access Memory) device, NAND flash, NOR flash, Magneto-resistive Random Access Memory, Ferroelectric Random Access Memory, 3-D memory, personal computer memory system, etc.).

Each die can be a respective semiconductor device (such as an integrated circuit) including multiple storage cells to store respective data. By way of a non-limiting example, die 110-1 can include a set of storage cells 150-1 to store first data, die 110-2 includes a set of storage cells 150-2 to store second data, die includes a set of storage cells 150-3 to store third data, and so on.

As mentioned, each die may not include respective storage cells and can be perform any suitable function.

Each die can be cut from a respective semiconductor wafer including multiple dies.

The one or more different kinds of dies 110 can be stacked on top of each other to form assembly 100. As mentioned, stacking of the dies 110 to produce a vertical stack can save on a corresponding region occupied by the dies 110 on a printed circuit board or other suitable host substrate on which assembly 100 is mounted.

In certain instances, such as shown, each die in the assembly 100 can require a different set of one or more voltages (such as Vcc1, Vcc2, Vcc3, and so on) to perform respective data operations (memory management operations, control operations, processing operations, sensor operations, etc.). The operations supported by each die in the assembly 100 can vary depending on the application where assembly is used.

For example, in one embodiment, the power management circuitry 142 (such as switch control circuitry 140, inductive element 130-1, inductive element 130-2, inductive element 130-3, conductive link 170-1, conductive link 170-2, and so on) disposed on the die 110-1 receives input voltage Vin and produces the voltages (such as Vcc1, Vcc2, Vcc3, and so on) used by each die to perform respective operations.

In one non-limiting example embodiment, when the dies 110 are configured to include non-volatile memory storage cells (such as based on NAND technology) to store data, depending on a type of technology used to fabricate a respective die, each of the storage cells in a respective die may be configured to store one or multiple bits of data depending on a respective bit-per-cell mode setting (e.g., multi-level cell MLC, single level cell SLC, etc.) of the memory die.

The power management circuitry 142 (such as switch control circuitry 140) and/or related components can be executed via any suitable type of resource such as analog circuitry, digital circuitry, digital signal processor hardware executing instructions, firmware, etc. Accordingly, embodiments herein can include hardware, software, hybrid of hardware and software etc.

As mentioned, in this non-limiting example embodiment, the power management circuitry 142 on die 110-1 includes switch control circuitry 140. Die 110-1 also includes inductive elements 130 including inductive element 130-1, inductive element 130-2, and inductive element 130-3 to facilitate conversion of input voltage Vin to one or more voltages such as Vcc1, Vcc2, Vcc3 etc. Accordingly, the first inductive element 130-1, the second inductive element 130-2, the third inductive element 130-3, etc., can be disposed in the first die 110-1.

In accordance with one embodiment, the switch control circuitry 140 is disposed in the first die 110-1 of the assembly 100 (such as a data storage apparatus or other suitable type of multi-chip device). The switch control circuitry 140 controls current through first inductive element 130-1 to produce a first voltage Vcc1. In one non-limiting example embodiment, the first voltage Vcc1 powers the first die 110-1 and supports of one or more different types of data management operations associated with storage cells 150-1. Alternatively, in another example embodiment, the first voltage Vcc1 is an intermediary voltage that does not power any circuitry disposed on the first die 110-1. As discussed herein, the first voltage Vcc1 is used as a basis to generate one or more other voltages such as Vcc2, Vcc3, etc.

As further shown in FIG. 1, the power management circuitry 142 includes inductive element 130-2. The inductive element 130-2 is coupled to receive the first voltage Vcc1 and produce a second voltage Vcc2. The conductive link 170-1 provides connectivity from the output of inductive element 130-2 to the diode D11 disposed on die 110-2. Conductive link can be fabricated from any suitable conductive material such as metal. Thus, the conductive link 170-1 conveys voltage Vcc2 to die 110-2. As previously discussed, the second voltage Vcc2 powers the second die 110-2 in the assembly 100 and supports one or more operations associated with die 110-2.

As yet further shown in FIG. 1, in this non-limiting example embodiment, the power management circuitry 142 includes 130-3. The third inductive element 130-3 is coupled to receive the first voltage Vcc1 and produce a third voltage Vcc3. The conductive link 170-2 provides connectivity from the output node of inductive element 130-3 to the diode D21 disposed on die 110-3. Conductive link 170-2 can be electrically isolated from components on die 110-2. Conductive link 170-2 can be fabricated from any suitable conductive material such as metal. Thus, the conductive link 170-2 conveys voltage Vcc3 to die 110-3. As previously discussed, the voltage Vcc3 powers the second die 110-3 in the assembly 100 and supports one or more respective data management operations associated with die 110-3.

In one embodiment, the first inductive element 130-1 and the second inductive element 130-2 are magnetically coupled to each other. In a similar manner, the first inductive element 130-1 and the third inductive element 130-3 also can be magnetically or inductively coupled to each other. Magnetic coupling helps to induce a flow of current through inductive element 130-2 and inductive element 130-3, producing potentially higher voltage levels.

Inductive elements can be formed in any suitable manner. For example, in one non-limiting example embodiment, each of the inductive elements 130 is fabricated via one or more continuous coiling paths disposed in layers of the die 110-1. The coiling paths can be co-located to provide magnetic coupling.

The inductors can be implemented on-die either as lateral inductors using given metal layers or vertically using TSVs (Through-Silicon Vias) in addition. For 2.5D type integration (as in FIG. 3), the inductor elements may also be implemented on the common interposer.

For power efficiencies above 70%, the coupling factor of inductive elements can be on the order of 0.9 or above. Each of inductive elements can be formed using TSVs in a spiral fashion in one or more layers of the die 110-1. Special magnetic materials can be added inside the coil or spiral loops of inductive elements 130 to provide magnetic coupling as previously discussed. However, very high efficiency for high voltage generation is not always required. If those voltages need to be active just along short time periods or during rare events—like for initial fusing operations—efficiency is potentially less relevant.

In one embodiment, the magnitude of voltage Vcc1 is greater than a magnitude of voltage Vin; the magnitude of voltage Vcc2 is greater than voltage Vcc1; the magnitude of voltage Vcc3 is greater than the magnitude of voltage Vcc2; and so on.

As previously discussed, the assembly 100 can be a vertical memory stack including die 110-1, die 110-2, die 110-3, etc. A planar facing 182-1 (top facing) of the first die 110-1 is substantially in contact with a planar facing 182-2 (bottom facing) of the second die 110-2.

The conductive link 170-1 extends from the first die 110-1 to the second die 110-2. The conductive link 170-1 conveys the second voltage Vcc2 from an output node of the inductive element 130-2 to an anode of diode D11 disposed in the second die 110-2.

In a similar manner, the conductive link 170-2 extends from the first die 110-1 to the third die 110-3. The conductive link 170-2 conveys the voltage Vcc3 from an output node of the inductive element 130-3 to an anode of diode D21 disposed in the die 110-3.

Each die can include different types of circuit components to support corresponding functionality. For example, die 110-1 can include a first set of semiconductor components such as transistors, diodes, etc., fabricated in accordance with a first fabrication technology; die 110-2 can include a second set of semiconductor components such as transistors, diodes, etc., fabricated in accordance with a second fabrication technology; die 110-3 can include a third set of semiconductor components such as transistors, diodes, etc., and so on.

The semiconductor components in the first set (such as on die 110-1) can be fabricated to tolerate application of a first maximum threshold voltage; the semiconductor components in the second set (such as on die 110-1) can be fabricated to tolerate application of a second maximum threshold voltage; the semiconductor components in the third set (on die 110-3) can be fabricated to tolerate application of a third maximum threshold voltage; and so on.

As further non-limiting example, assume that the circuitry such as semiconductor components on the die 110-1 tolerate application of a maximum voltage of 2.2 volts; assume that the circuitry such as semiconductor components on the die 110-2 tolerate application of a maximum voltage of 2.9 volts; assume that the circuitry such as semiconductor components on the die 110-3 tolerate application of a maximum voltage of 3.6 volts.

In such an embodiment, and by way of a non-limiting example, the power management circuitry 142 converts input voltage Vin (such as 1.0 volts DC) into Vcc1 (such as 1.8 volts DC), which is below maximum threshold value 2.2 volts DC; the power management circuitry 142 converts input voltage Vcc1 (such as 1.8 volts DC) into Vcc2 (such as 2.5 volts DC), which is below maximum threshold value 2.9 volts DC; the power management circuitry 142 converts input voltage Vcc1 (such as 1.8 volts DC) into Vcc3 (such as 3.2 volts DC), which is below maximum threshold value 3.6 volts DC.

Accordingly, the power management circuitry 142 can be configured to: generate the magnitude of the first voltage Vcc1 (1.8 VDC) to be less than the first maximum threshold voltage (2.2 VDC); generate the magnitude of the second voltage Vcc2 (2.5 VDC) to be greater than the first maximum threshold voltage (2.2 VDC) but less than the magnitude of the second maximum threshold voltage 2.9 VDC).

The semiconductor circuit components (such as transistors, diodes, etc.) in the die 110-1 are electrically isolated from the second voltage Vcc2 (2.5 VDC) to prevent damage to the semiconductor components in the die 110-1. Accordingly, embodiments herein can include isolating the output node of inductive element 130-2 (which generates the higher, potentially damaging voltage Vcc2) from other components in die 110-1. An end of conductive link 170-1, which can tolerate a magnitude of the voltage Vcc2, conveys the voltage Vcc2 to die 110-2.

As previously discussed, the dies in assembly 100 can be fabricated in accordance with different technology. The dies also can be from the same technology type. In one example embodiment, the first die 110-1 is a first DRAM (Dynamic Random Access Memory) device in the assembly 100; the second die 110-2 is a second DRAM (Dynamic Random Access Memory) device in the assembly 100.

Note again that generation of different voltages is shown by way of non-limiting example only and that the dies 110 in assembly 100 can be fabricated in accordance with a same fabrication technology. The power management circuitry 142 can be configured to generate a same or substantially same voltage level for powering each of the respective dies 110 in the assembly 100.

Figure 2:
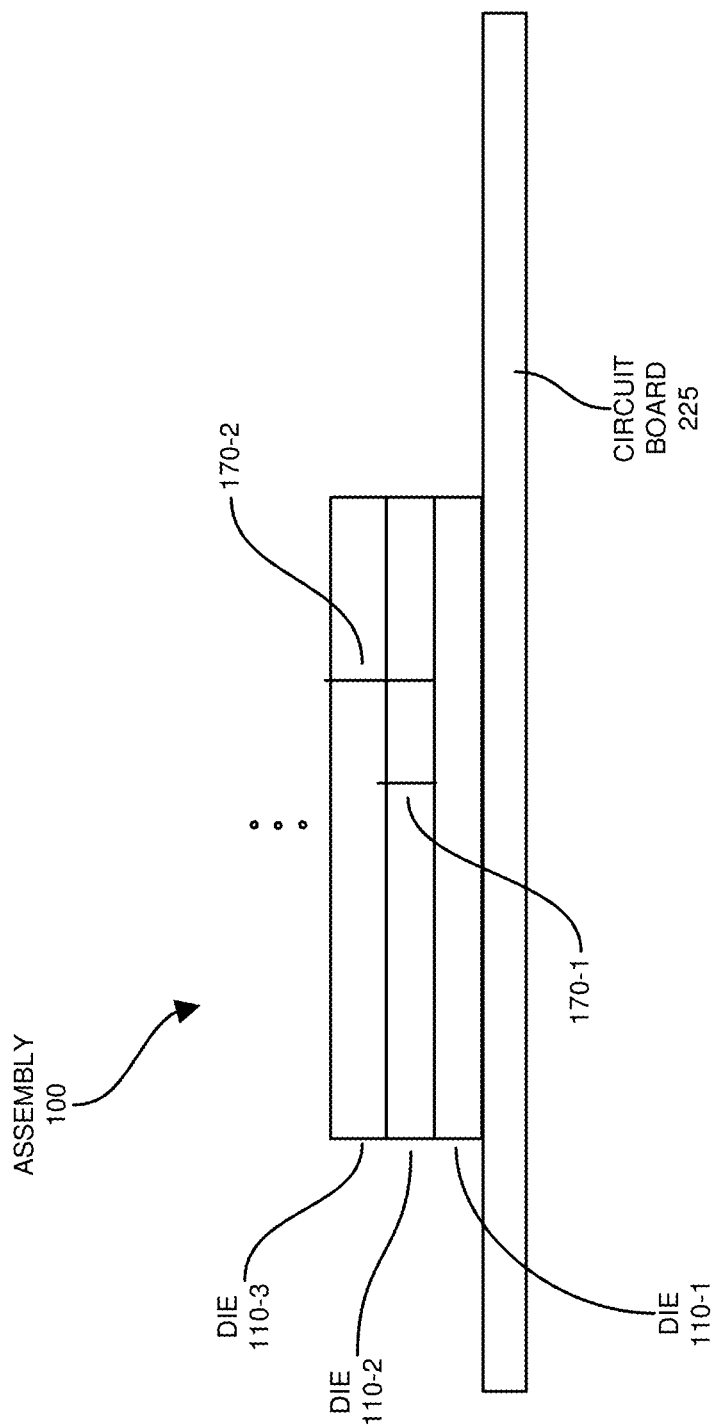
FIG. 2 is an example side view diagram illustrating an assembly according to embodiments herein.

FIG. 2 is an example side view diagram illustrating stacking of multiple dies to produce an assembly according to embodiments herein.

As previously discussed, assembly 100 can include multiple dies including die 110-1, die 110-2, die 110-3, and so on. As shown in this side view diagram of assembly 100, die 110-2 is stacked on the first die 110-1; die 110-3 is stacked on the die 110-2; and so on.

The assembly 100 can be mounted to a respective circuit board 225. As mentioned, stacking of dies 110 to produce assembly 100 results in substantial real estate space savings on circuit board 225 because the footprint of assembly 100 is generally equal to a footprint of die 110-1 even though assembly 100 includes additional levels (such as die 110-2, die 110-3, etc.) to store data or perform any other suitable function.

In one embodiment, the conductive link 170-1 and conductive link 170-2 are fabricated as so-called TSVs (Through-Silicon Vias). As previously discussed, the dies 110 in assembly 100 can be semiconductor devices or integrated circuit. The conductive links through the dies provide connectivity from one layer of silicon (such as die 110-1) to the next layer of silicon (such as die 110-2) in the assembly 100.

If desired, one or more of the inductive elements 130 can be disposed on the host substrate 225 instead of being disposed in die 110-1. In such an instance, the assembly 100 and circuit board 225 includes additional conductive links facilitating conveyance of the generated voltages Vcc1, Vcc2, Vcc3 etc., from inductive elements 130 on circuit board 225 through the die 110-1 to other respective dies in the stack.

Additional details of switching operation are discussed below.

Figure 3:
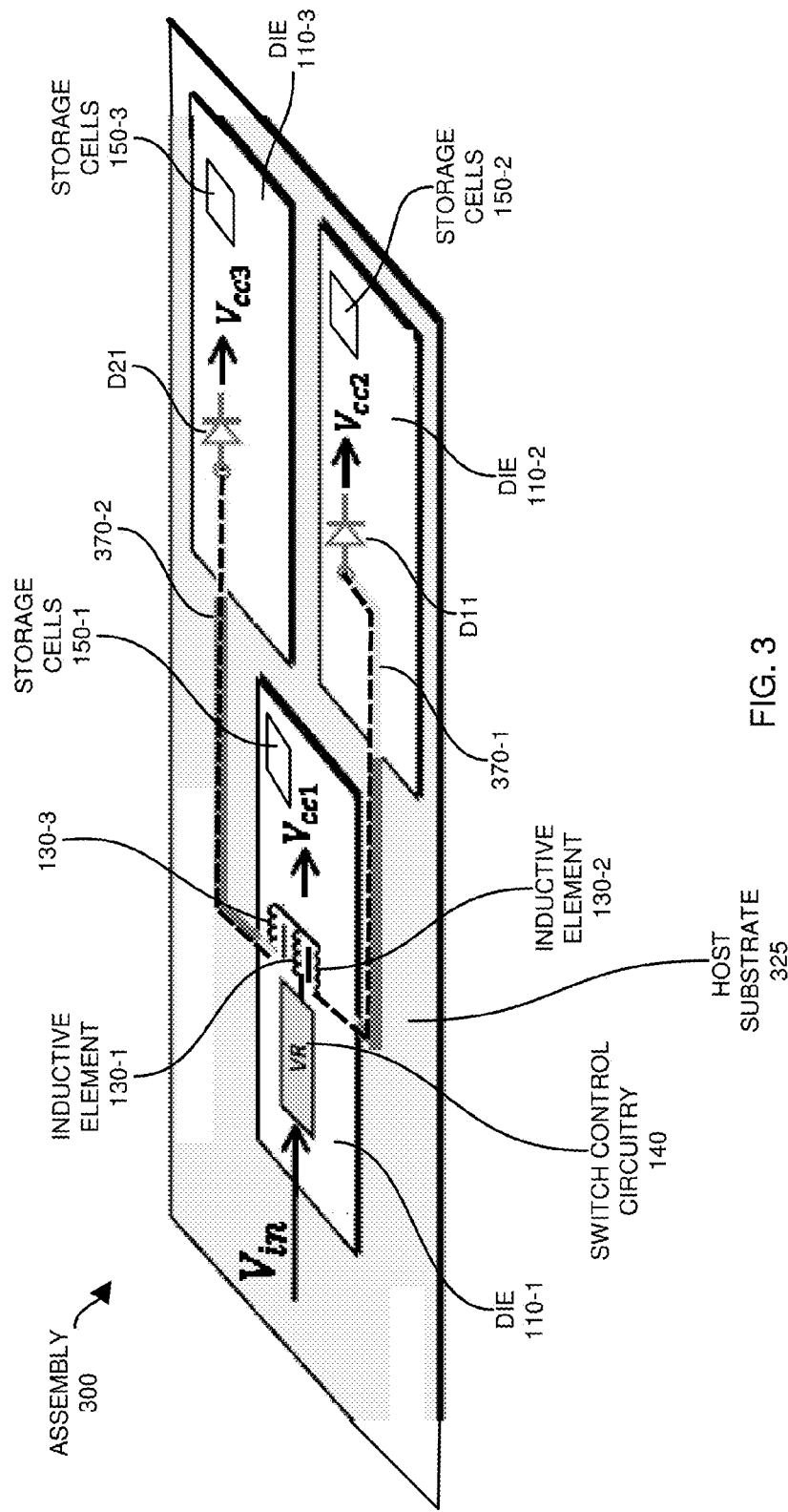
FIG. 3 is an example three-dimensional diagram illustrating a planar multi-die assembly according to embodiments herein.

FIG. 3 is an example three-dimensional diagram illustrating a planar assembly according to embodiments herein.

As previously discussed, the assembly 110 can be configured as a vertical memory stack. In accordance with further alternative embodiments, an assembly can be configured as a planar assembly on which the components such as a plurality of dies are mounted.

For example, assembly 300 can include a host substrate 325 (such as an interposer). Switch control circuitry 140 and corresponding inductive elements 130 operate in a similar manner as discussed above. However, instead of being stacked on top of each other to form a respective stack as shown, the die 110-1, the die 110-2, and the die 110-3 can be disposed adjacent to each other on an exposed facing of the host substrate 325.

In this non-limiting planar example embodiment, the conductive link 370-1 extends laterally on the facing of the host substrate 325 from the inductive element 130-2 on the first die 110-1 to the diode D11 disposed in the die 110-2. Thus, the conductive link 370-1 conveys the voltage Vcc2 from the inductive element 130-2 to a diode D11 disposed in the die 110-2.

The conductive link 370-2 extends laterally on the facing of the host substrate 325 from the inductive element 130-3 on the first die 110-1 to the diode D21 disposed in the die 110-3. Thus, the conductive link 370-2 conveys the voltage Vcc3 from the inductive element 130-3 to a diode D21 disposed in the die 110-3.

If desired, one or more of the inductive elements 130 can be disposed on the host substrate 325. In such an instance, the assembly 300 includes additional conductive links facilitating conveyance of the generated voltages Vcc1, Vcc2, Vcc3 etc., to respective dies 110.

Figure 4:
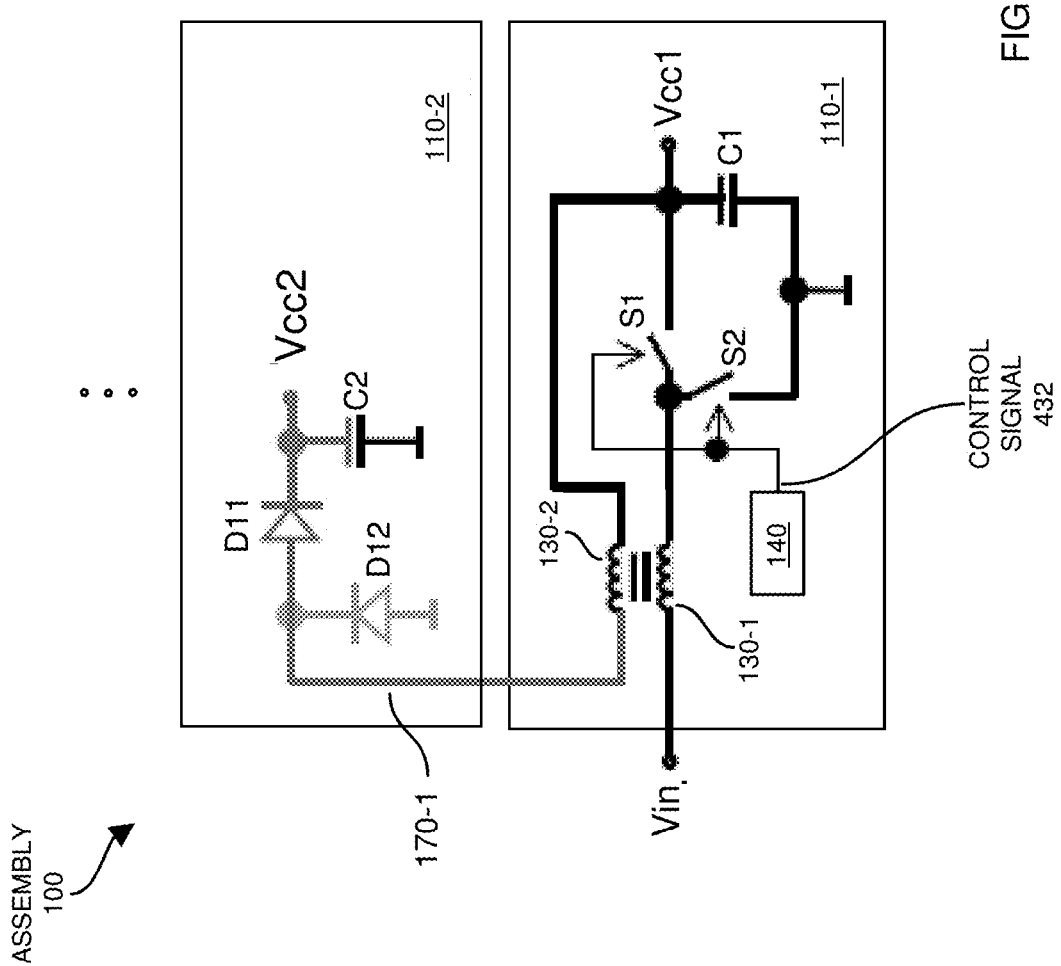
FIG. 4 is an example diagram illustrating power management in a multi-die assembly according to embodiments herein.

FIG. 4 is an example diagram illustrating power management in an assembly according to embodiments herein.

As shown, assembly 100 can include switch control circuitry 140 as well as corresponding switches S1 and S2. Switch control circuitry 140 generates control signals 432 to control states of switches S1 and S2. A first node (such as an input node) of the inductive element 130-1 is electrically coupled to the input voltage Vin. The input voltage Vin is a source providing the current through the inductive element 130-1 to produce the voltage Vcc1.

Power management circuitry 142 in die 110-1 includes switch S1 controlled by the switching circuitry 140. The switch S1 is disposed between the first inductive element 130-1 and the second inductive element 130-2. As discussed below in more detail, the switch S1 produces the first voltage to power the first die 110-1. The second inductive element 130-2 receives the first voltage Vcc1 and produces the second voltage Vcc2, powering the second die 110-2.

More specifically, during operation in one embodiment, via control signals 432, the switch control circuitry 140 controls switch S1 to an ON state while switch S2 is set to an OFF state. The switch control circuitry 140 controls switch S2 to an OFF state while switch S2 is set to an ON state. The duty cycle of the control signals 432 can be adjusted to vary a magnitude of the output voltage Vcc1 to a desired level.

In one embodiment, the power management circuitry 142 behaves like a buck-boost DC-to-DC converter in which the input voltage Vin is boosted to produce voltage Vcc1. Capacitor C1 provides stability and filters switching noise.

Because of the magnetic flux coupling of the inductive element 130-1 to the inductive element 130-2, control of current through inductive element 130-1 to generate voltage Vcc1 results in generation of voltage Vcc2 from an output node of inductive element 130-2 coupled to the conductive link 170-1. The voltage generated by inductive element 130-2 depends on a number of effective windings or coils in each of inductive elements 130-1 and 130-2 as well as the amount of magnetic coupling between the inductive elements.

Die 110-2 includes diode D11 and diode D12 to rectify the signal received on conductive link 170-1. Capacitor C2 provides stability and filters switching noise.

Figure 5:
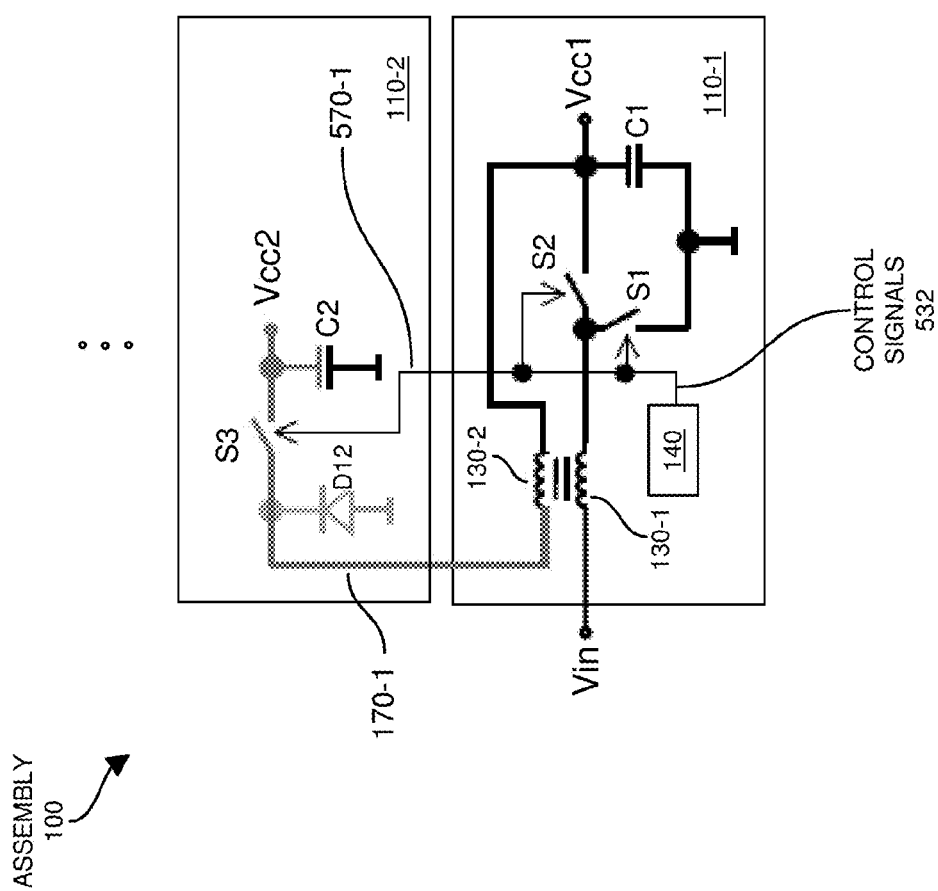
FIG. 5 is an example diagram illustrating power management in a multi-die assembly according to embodiments herein.

FIG. 5 is an example diagram illustrating power management in a assembly according to embodiments herein.

As shown, switch control circuitry 140 produces control signals 532 in a similar manner as discussed above to produce voltage Vcc1. However, in this example embodiment, the die 110-2 includes a switch S3 controlled by switch control circuitry 140. For example, a first conductive link such as conductive link 170-1 extends from the die 110-1 to the die 110-2. The conductive link 170-1 conveys the voltage Vcc2 outputted from inductive element 130-2 in the die 110-1 to switch component S3 disposed in the die 110-2.

Conductive link 570-1 extends from the switch control circuitry 140 in die 110-1 to the die 110-2. In one non-limiting example embodiment, the switch control circuitry 140 generates a control signal to control switch S3 independent of the control signals used to control switches S1 and S2. The conductive link 570-1 conveys a switch control signal produced by the switch control circuitry 140 to the switch component S3. Via the generated control signal, the switch control circuitry 140 controls a state of the switch component S3 and a magnitude of the voltage Vcc2.

Figure 6:
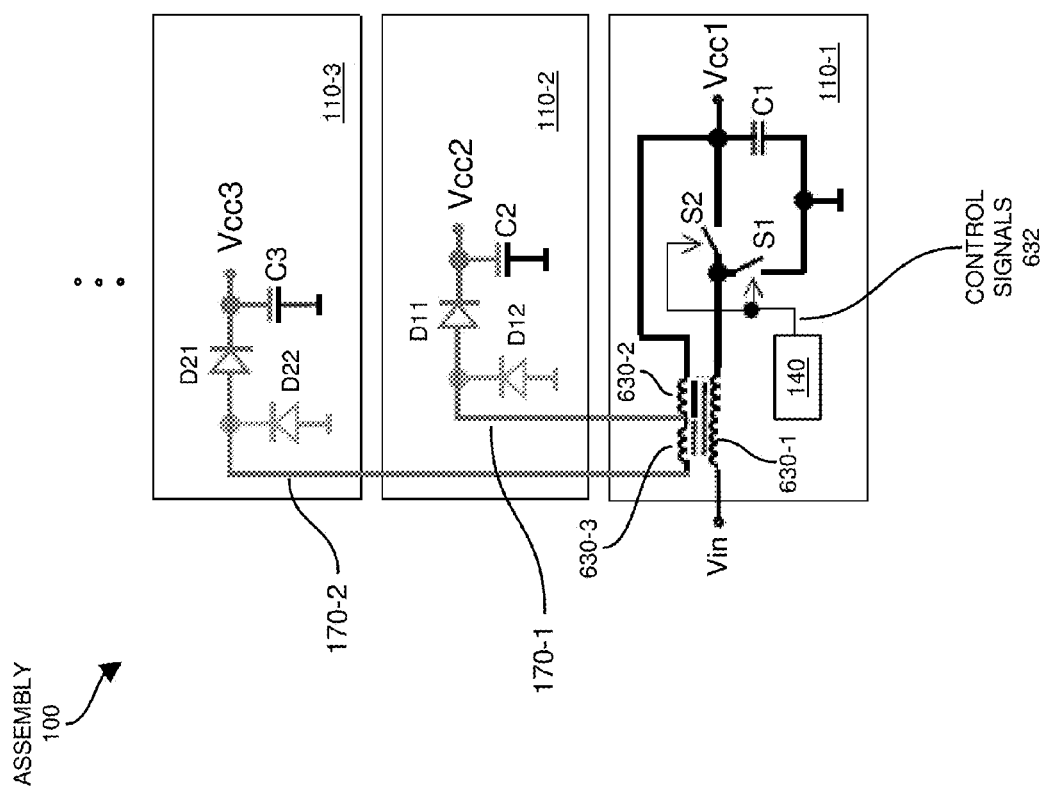
FIG. 6 is an example diagram illustrating power management in a multi-die assembly according to embodiments herein.

In one embodiment, the switch control circuitry 140 controls switches S2 and S3 to an ON state at substantially the same time when switch S1 is controlled to an OFF state. The switch control circuitry 140 controls switches S2 and S3 to an OFF state at substantially the same time when switch S1 is controlled to an ON state FIG. 6 is an example diagram illustrating power management in an assembly according to embodiments herein.

In this example embodiment, the die 110-1 includes inductive element 630-1, inductive element 630-2, and inductive element 630-3. In a manner as previously discussed, the switch control circuitry 140 controls a state of switches S1 and S2 to produce voltage Vcc1 from Voltage Vin.

The series connection of inductive element 630-2 and inductive element 630-3 are magnetically coupled to inductive element 630-1 as shown. During operation of controlling switches S1 and S2 to produce output voltage Vcc1, the inductive elements 630-2 and 630-3 produce respective voltages Vcc2 and Vcc3 for powering respective dies 110-2 and 110-3 as shown.

Figure 7:
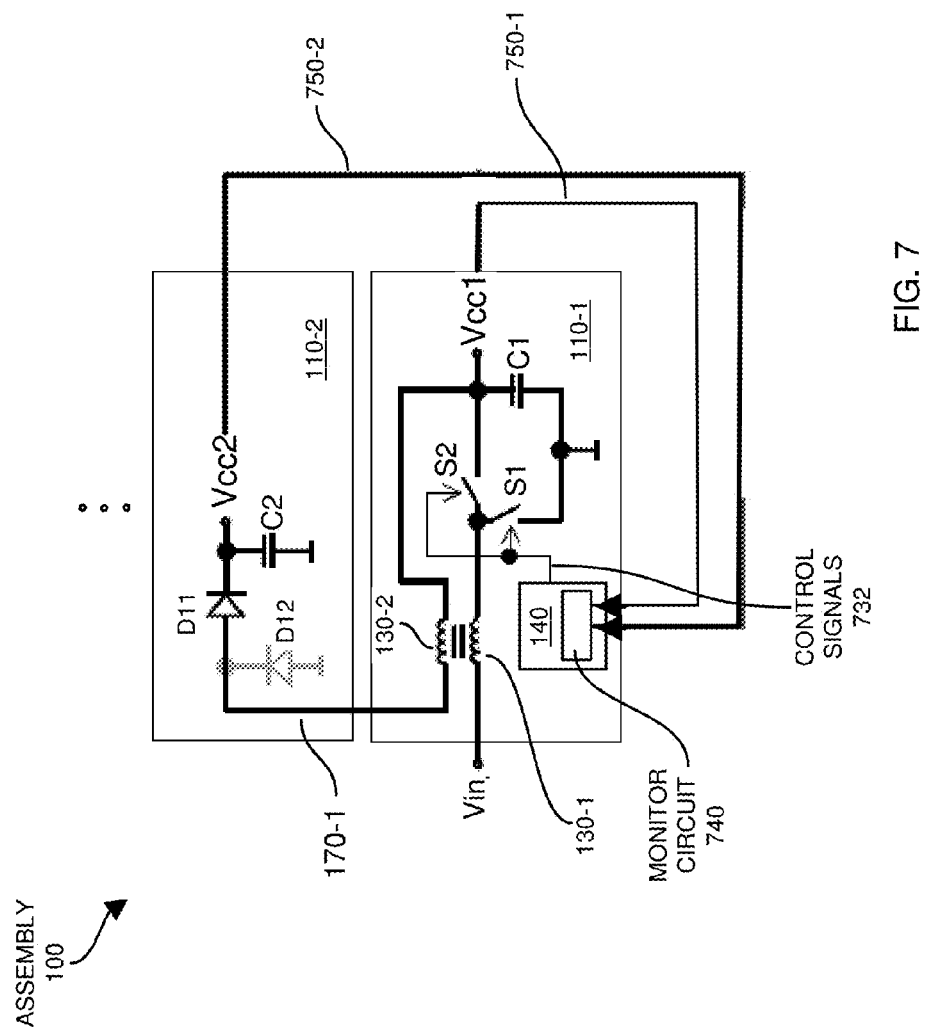
FIG. 7 is an example diagram illustrating power management in a multi-die assembly according to embodiments herein.

FIG. 7 is an example diagram illustrating power management in an assembly according to embodiments herein.

The embodiments as discussed above illustrate a way of performing open loop controls to generate one or more voltages. In accordance with alternative embodiments, it may be desirable to produce one or more of voltages Vcc1, Vcc2, Vcc3, etc., based on feedback.

For example, in one embodiment, the switch control circuitry 140 includes a monitor circuit 740. As its name suggests, the monitor circuit 740 monitors a magnitude of the voltage Vcc1 as received in feedback path 750-1. Based on the feedback, the switch control circuitry 140 controls switching of the current through the first inductive element 130-1 (as supplied by Vin) to produce the voltage Vcc1 within a desired voltage range.

In yet further embodiments, the monitor circuit 740 can be configured to monitor a magnitude of the voltage Vcc2 as received in feedback path 750-2. Based on the feedback, the switch control circuitry 140 controls switching of the current through the inductive element 130-2 (as supplied by Vcc1) to produce the voltage Vcc2 within a desired voltage range.

As previously discussed, if desired, diode D11 can be replaced with a switch such as switch S3. In such an embodiment, the switch control circuitry 140 can control switch S1 and S2 independently of controlling switch S3 to produce Vcc1 and Vcc2 within desired ranges.

Figure 8:
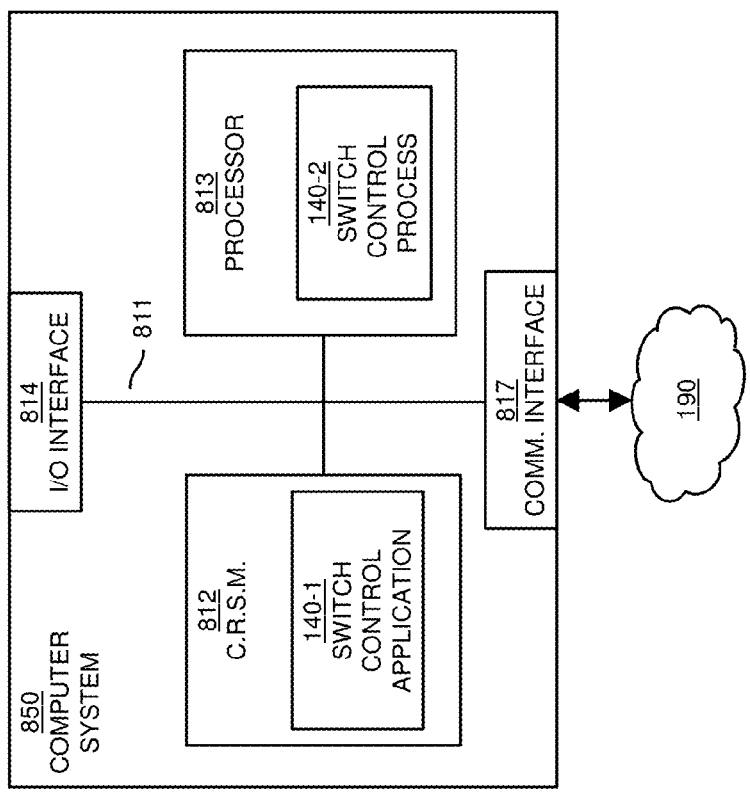
FIG. 8 is an example diagram illustrating a computer architecture that can be used to execute one or more methods according to embodiments herein.

FIG. 8 is an example block diagram of a computer system for implementing power management according to embodiments herein.

Computer system 850 can be configured to execute any of the operations with respect to switch control circuitry 140.

As shown, computer system 850 of the present example can include an interconnect 811 that couples computer readable storage media 812 such as a physical non-transitory type of media (i.e., any type of physical hardware storage medium) in which digital information can be stored and retrieved, a processor 813 (i.e., one or more processor devices or computer processor hardware), I/O interface 814, communications interface 817, etc.

Computer readable storage medium 812 can be any physical or tangible hardware storage device or devices such as memory, optical storage, hard drive, floppy disk, etc. In one embodiment, the computer readable storage medium 812 (e.g., a computer readable hardware storage) stores instructions and/or data.

In one embodiment, communications interface 817 enables the computer system 850 and respective processor 813 (computer processor hardware) to communicate over a resource such as network 190 to retrieve information from remote sources and communicate with other computers. I/O interface 814 enables the computer system 850 to receive feedback and/or output control signals to control switches as previously discussed.

As shown, computer readable storage media 812 is encoded with switch control application 140-1 (e.g., software, firmware, etc.) executed by processor 813. The switch control application 140-1 can be configured to include instructions to implement any of the operations as discussed herein.

During operation of one embodiment, processor 813 accesses computer readable storage media 812 via the use of interconnect 811 in order to launch, run, execute, interpret or otherwise perform the instructions in switch control application 140-1 stored on computer readable storage medium 812.

Execution of the switch control application 140-1 produces processing functionality such as switch control process 140-2 in processor 813. In other words, the switch control process 140-2 associated with processor 813 represents one or more aspects of executing switch control application 140-1 within or upon the processor 813 in the computer system 850.

Those skilled in the art will understand that the computer system 850 can include other processes and/or software and hardware components, such as an operating system that controls allocation and use of hardware resources, software resources, etc., to execute switch control application 140-1.

In accordance with different embodiments, note that computer system 850 may be any of various types of devices, including, but not limited to, a mobile computer, a personal computer system, a wireless device, base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, or in general any type of computing or electronic device.

Functionality supported by the different resources will now be discussed via flowcharts in FIG. 9. Note that the processing in the flowcharts below can be executed in any suitable order.

Figure 9:
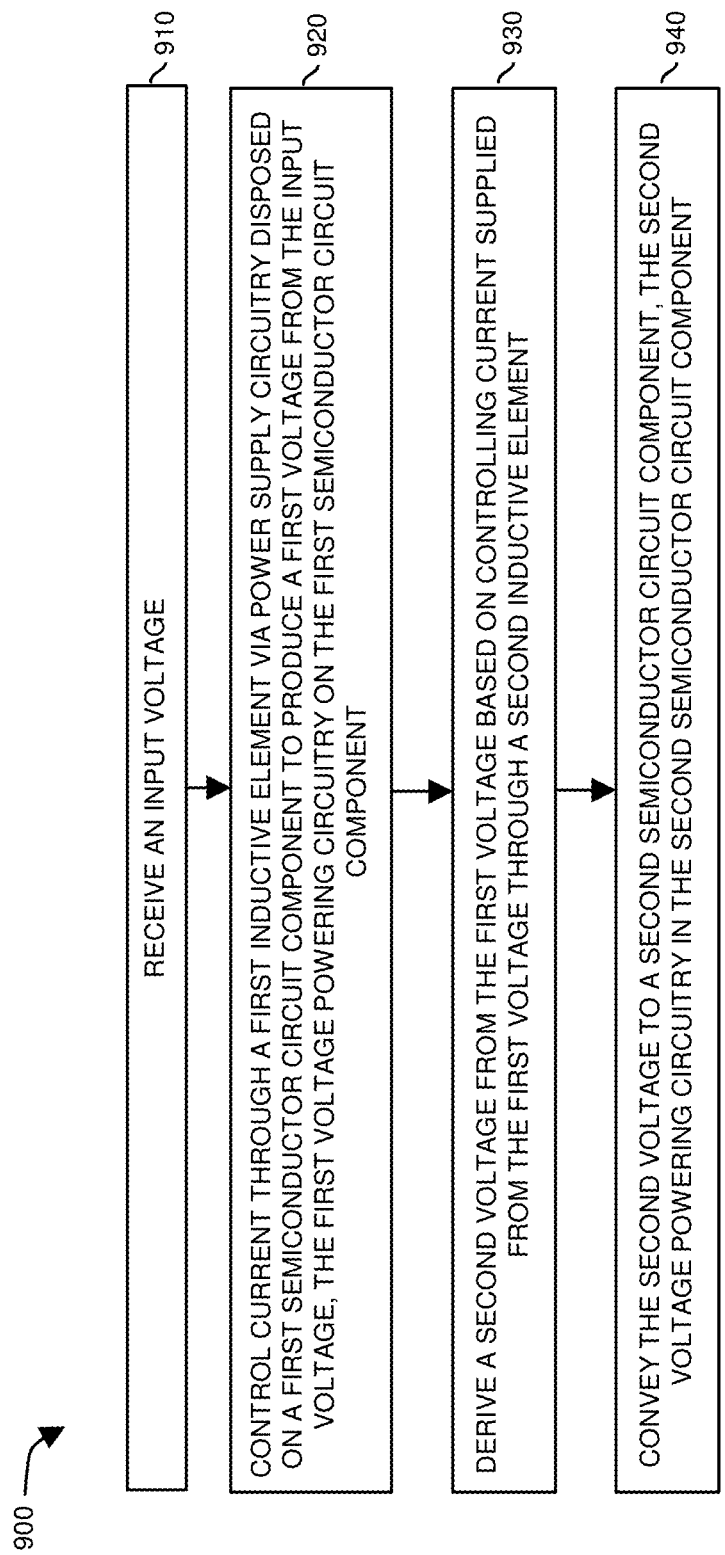
FIG. 9 is an example flowchart illustrating a method according to embodiments herein.

FIG. 9 is a flowchart 900 illustrating an example method according to embodiments. Note that there will be some overlap with respect to concepts as discussed above.

In processing block 910, the power management circuitry 142 receives an input voltage, Vin.

In processing block 920, the power management circuitry 142 controls current through a first inductive element 130-1 to produce a first voltage Vcc1 from the input voltage. The first generated voltage Vcc1 powers circuitry (such as storage cells 150-1) on the first die 110-1.

In processing block 930, the power management circuitry 142 derives a second voltage Vcc2 via current supplied from the first voltage Vcc1 through the second inductive element 130-2.

In processing block 940, the power management circuitry 142 conveys the second voltage Vcc2 to a second die 110-2 in the assembly 100. The second generated voltage Vcc2 powers circuitry (such as storage cells 150-3) in the second die 110-2.

Figure 10:
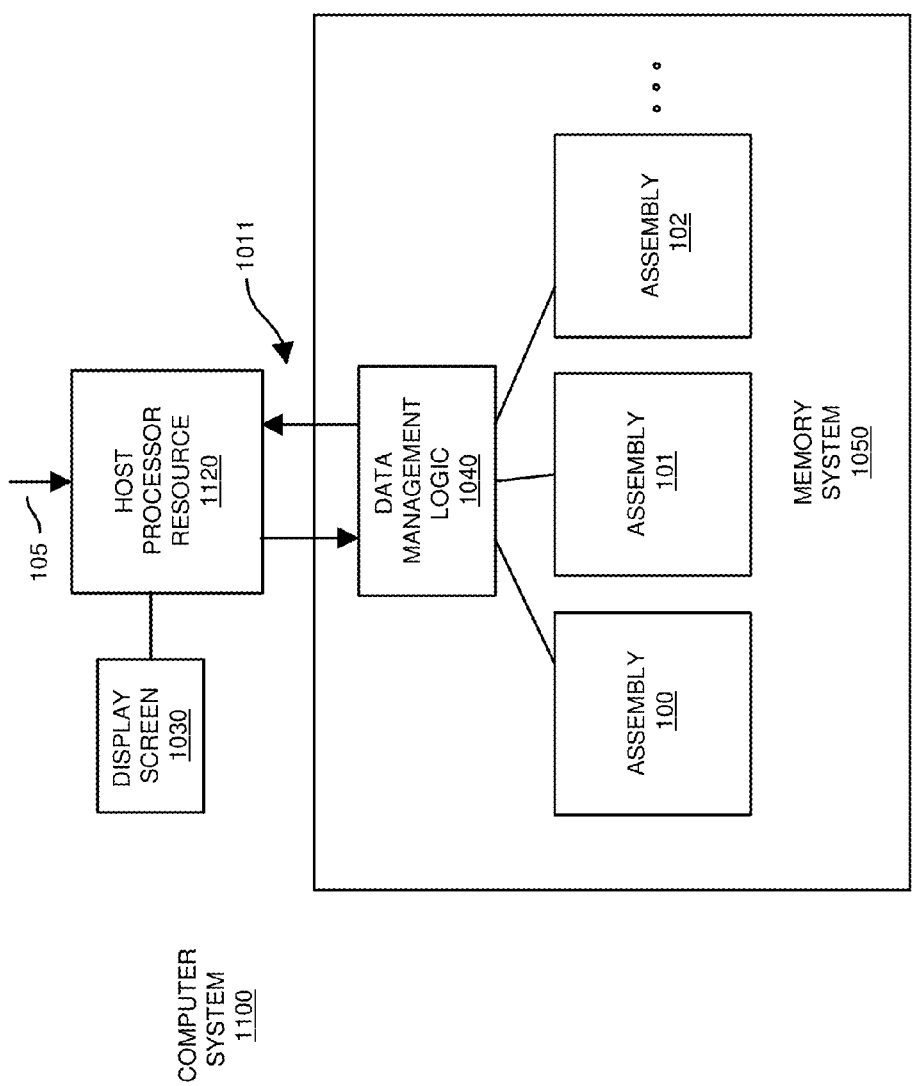
FIG. 10 is an example diagram illustrating use of dies and/or multi-die assemblies in a respective computer system according to embodiments herein.

FIG. 10 is an example diagram illustrating use of one or more assemblies in a respective computer system according to embodiments herein.

As shown, computer system 1100 can include a host processor resource 1120 and memory system 1050. Host processor resource 1120 can be or include computer processor hardware such as one or more processor devices. By way of a non-limiting example, computer system 1100 can be any suitable type of resource such as a personal computer, cellular phone, mobile device, camera, etc., using memory system 1050 to store data.

In one embodiment, memory system 1050 includes one or more data storage assemblies such as assembly 100, assembly 101, assembly 102, etc., to store respective data. As previously discussed, if desired, the assemblies can be configured to different types of functions.

Host processor resource 1120 has access to memory system 1050 via interface 1011. Interface 1011 can be any suitable link enabling data transfers. For example, the interface 1011 can be any suitable type of communication link supporting a transfer of data. By way of a non-limiting example, the communication link can be a SCSI (Small Computer System Interface), SAS (Serial Attached SCSI), SATA (Serial Advanced Technology Attachment), USB (Universal Serial Bus), PCIE (Peripheral Component Interconnect Express) bus, etc.

Via interface 1011, the host processor resource 1120 of computer system 1100 is able to retrieve data from and store data in memory system 1050.

In one embodiment, the checkout station 1100 includes host processor resource 1120 (such as host computer processor hardware) configured to manage settings of corresponding data stored in assembly 100, which includes storage cells 150-1 of the die 110-1 and storage cells 150-2 in the die 110-2.

As an example, assume that the host processor resource 1120 receives a request to perform a respective function as specified by input 105 from a user operating the computer system 1100. Host processor resource 1120 executes the function, which can include transmitting a request over interface 1011 to data management logic 1040 for retrieval of data at a specified logical address. In addition to performing other functions, the data management logic 140 can be configured to map the logical address of the received access request to an appropriate physical address in memory system 1050 and retrieve the data from one or more data storage assemblies. Subsequent to retrieving the appropriate data from memory system 1050 (and one or more assemblies 100, 101, 102, . . . ), data management logic 140 transmits the retrieved data to host processor resource 1120 satisfying the request for data.

In one non-limiting example embodiment, the host processor resource 1120 initiates display of an image on display screen 1030 depending on the data received from the data management logic 1040. In one embodiment, the checkout station 100 includes display screen 1030 on which to render an image based at least in part on corresponding data stored in the die 110-1 and/or die 110-2 of assembly 100.

As a further example, note that the host processor resource 1120 can receive a request to perform a respective function as specified by input 105 from a user. Host processor resource 1120 executes the function and communicates with data management logic 1040 to store data at a logical address as specified by the host processor resource 1120. In response to receiving the request, the data management logic 1040 maps the logical address to an appropriate physical address and stores the received data in a corresponding location in one or more of assemblies 100, 101, 102, etc.

As previously discussed, each of the assemblies can include multiple dies. Different internally generated voltages (such as voltage Vcc1, Vcc2, Vcc3 etc.) can be used by each of the respective memory dies to perform appropriate data management operations.

Different Permutations of Disclosed Example Embodiments

A first example embodiment as discussed herein includes an apparatus. The apparatus comprises switch control circuitry, a first inductive element, and a second inductive element. The switch control circuitry is disposed in a first die of the apparatus. The switch control circuitry controls current through the first inductive element to produce a first voltage. The second inductive element is coupled to receive the first voltage and produces a second voltage. The second voltage powers a second die in the apparatus.

The first example embodiment can be implemented along with any of one or more of the following features to produce yet further embodiments below:

In accordance with one embodiment, the first voltage powers the first die.

In one embodiment, the first inductive element is magnetically coupled to the second inductive element.

In accordance with another embodiment, the first inductive element and the second inductive element are disposed on the first die. A magnitude of the second voltage is greater than a magnitude of the first voltage.

In accordance with further embodiments, the second die is stacked on the first die. A magnitude of the second voltage is greater than a magnitude of the first voltage.

In yet another embodiment, the first die includes a set of storage cells; the set of storage cells in the first die stores first data. The second die includes a set of storage cells. The set of storage cells in the second die stores second data.

In accordance with another embodiment, the first inductive element and the second inductive element are disposed in the first die.

In still further embodiments, the first die and the second die are disposed in a vertical stack in which a planar facing of the first die is substantially in contact with a planar facing of the second die. A conductive link extends from the first die to the second die. The conductive link conveys the second voltage from the second inductive element to a diode disposed in the second die.

In accordance with further embodiments, the conductive link conveys the second voltage from an output node of the second inductive element to an anode of the diode.

In still further embodiments, a first node of the first inductive element is coupled to an input voltage; the input voltage provides the current through the first inductive element. A magnitude of the first voltage is greater than a magnitude of the input voltage.

The apparatus can further include a host substrate. The first die and the second die can be disposed adjacent to each other on a facing of the host substrate. A conductive link extends on the facing of the host substrate from the first die to the second die. The conductive link conveys the second voltage from the second inductive element to a diode disposed in the second die.

In one embodiment, the first inductive element and the second inductive element are disposed on the host substrate.

In accordance with yet further embodiments, the first die is a first DRAM (Dynamic Random Access Memory) device. The second die is a second DRAM (Dynamic Random Access Memory) device.

In a further embodiment, a magnitude of the second voltage is greater than a magnitude of the first voltage. The first die includes a first set of semiconductor components fabricated in accordance with a first fabrication technology. The semiconductor components in the first set are tolerable of application of a first maximum threshold voltage. The second die includes a second set of semiconductor components. The second set of semiconductor components can be fabricated in accordance with a second fabrication technology. The semiconductor components in the second set are tolerable of application of a second maximum threshold voltage. The magnitude of the first voltage is less than the first maximum threshold voltage. The magnitude of the second voltage is greater than the first maximum threshold voltage. The magnitude of the second voltage is less than the second maximum threshold voltage.

In another embodiment, the semiconductor components in the first set are electrically isolated from the second voltage to prevent damage to the semiconductor components in the first set. The first voltage is used to perform storage operations with respect to storage cells in the first die. The second voltage is used to perform storage operations with respect to storage cells in the second die.

In still further embodiments, the apparatus includes a first conductive link extending from the first die to the second die. The first conductive link conveys the second voltage from the first die to a switch component disposed in the second die. The second conductive link extends from the first die to the second die. The second conductive link conveys a switch control signal produced by the switch control circuitry to the switch component. The switch control signal controls a state of the switch component.

The apparatus can further include a monitor circuit. The monitor circuit monitors a magnitude of the first voltage as feedback. The switch control circuitry controls switching of the current through the first inductive element to produce the first voltage within a desired voltage range.

In accordance with another embodiment, the apparatus can include a monitor circuit configured to monitor a magnitude of the second voltage as feedback. The switch control circuitry controls switching of the current through the second inductive element to produce the second voltage within a desired voltage range.

In one embodiment, the apparatus includes a switch controlled by the switching circuitry. The switch can be disposed between the first inductive element and the second inductive element. The switch provides the first voltage to power the first die. The second inductive element receives the first voltage and produces the second voltage powering the second die.

A computer system can be configured to include the apparatus. Such a computer system can be configured to include host computer processor hardware configured to manage settings of corresponding data stored in storage cells of the first die and storage cells in the second die.

The computer system as discussed herein can include a display screen on which to render an image based at least in part on the corresponding data stored in the first die and the second die of the assembly.

A second example embodiment as discussed herein includes a method for managing power in a assembly, the method can include: receiving an input voltage; controlling current through a first inductive element via switching circuitry disposed on a first die to produce a first voltage from the input voltage; deriving a second voltage via current supplied from the first voltage through a second inductive element; and conveying the second voltage to a second die, the second voltage powering circuitry in the second die.

The second example method embodiment can be implemented along with any of one or more of the following features to produce yet further embodiments below:

In accordance with one embodiment, the first voltage powers the first die.

In one embodiment, the method further includes producing the second voltage to be greater than a magnitude of the first voltage.

In accordance with another method embodiment, the first inductive element and the second inductive element are disposed in the first die.

In accordance with another method embodiment, the first die and the second die are disposed in a vertical stack in which a planar facing of the first die is in contact with a planar facing of the second die. One method embodiment further comprises: conveying the second voltage on a conductive link extending from the first die to the second die, the conductive link conveying the second voltage from the second inductive element to a diode disposed in the second die.

In accordance with another method embodiment, the method embodiment further comprises: receiving an input voltage, the input voltage being a source for the current through the first inductive element; and producing a magnitude of the second voltage to be greater than a magnitude of the input voltage.

In accordance with another method embodiment, the semiconductor components in the first set are electrically isolated from the second voltage to prevent damage to the semiconductor components in the first set. The method embodiment further comprises: utilizing the first voltage to perform storage operations with respect to storage cells in the first die; and utilizing the second voltage to perform storage operations with respect to storage cells in the second die.

In accordance with another embodiment, the method embodiment can include: conveying the second voltage from the first die to a switch component disposed in the second die; and conveying a switch control signal to the switch component, the switch control signal controlling a state of the switch component.

In accordance with another method embodiment, the method embodiment can include: monitoring a magnitude of the first voltage; and based on the magnitude of the first voltage, controlling switching of the current through the first inductive element to produce the first voltage within a desired voltage range.

In accordance with another method embodiment, the method embodiment can further include: monitoring a magnitude of the second voltage; and based on the magnitude of the second voltage, controlling switching of the current through the second inductive element to produce the second voltage within a desired voltage range.

A third example embodiment as discussed herein includes computer-readable storage hardware (e.g., computer readable storage medium) having instructions stored thereon, the instructions, when carried out by computer processor hardware, cause the computer processor hardware to perform operations of: controlling current through a first inductive element via switching circuitry disposed on a first die to produce a first voltage from the input voltage; and deriving a second voltage from the first voltage based on controlling current supplied from the first voltage through a second inductive element, a conductive link conveying the second voltage to a second die, the second voltage powering circuitry in the second die.

The third example embodiment can be implemented along with any of one or more of the following features to produce yet further embodiments below:

In accordance with one embodiment, the first voltage powers circuitry on the first die.

In one embodiment, the computer-readable storage hardware includes instructions that further cause the computer processor hardware to perform operations of producing the second voltage to be greater than a magnitude of the first voltage.

In accordance with another embodiment, the computer-readable storage hardware includes instructions that further cause the computer processor hardware to perform operations of: receiving an input voltage; and producing a magnitude of the first voltage to be greater than a magnitude of an input voltage, the input voltage being a source for the current through the first inductive element.

In still further embodiments, the computer-readable storage hardware includes instructions that further cause the computer processor hardware to perform operations of: monitoring a magnitude of the first voltage; and based on the magnitude of the first voltage, controlling switching of the current through the first inductive element to produce the first voltage within a desired voltage range.

In yet further embodiments, the computer-readable storage hardware can include further instructions that cause the computer processor hardware to perform operations of: monitoring a magnitude of the second voltage; and based on the magnitude of the second voltage, controlling switching of the current through the second inductive element to produce the second voltage within a desired voltage range.

A fourth example embodiment as discussed herein includes a power manage comprising: means for receiving an input voltage; means for controlling current through a first inductive element via switching circuitry disposed on a first die to produce a first voltage from the input voltage; means for deriving a second voltage via current supplied from the first voltage through a second inductive element; and means for conveying the second voltage to a second die, the second voltage powering circuitry in the second die.

The fourth example embodiment can be implemented along with any of one or more of the following features to produce yet further embodiments below:

In accordance with one embodiment, the first voltage powers circuitry on the first die.

In one embodiment, the power manager includes means for producing the second voltage to be greater than a magnitude of the first voltage.

In accordance with another embodiment, the first inductive element and the second inductive element are disposed in the first die.

In accordance with yet another embodiment, the first die and the second die are disposed in a vertical stack in which a planar facing of the first die is in contact with a planar facing of the second die. The power manager further comprises: means for conveying the second voltage on a conductive link extending from the first die to the second die, the conductive link conveying the second voltage from the second inductive element to a diode disposed in the second die.

In yet further embodiments, the power manager comprises: means for receiving an input voltage, the input voltage being a source for the current through the first inductive element; and means for producing a magnitude of the second voltage to be greater than a magnitude of the input voltage.

In still further embodiments, the semiconductor components in the first set are electrically isolated from the second voltage to prevent damage to the semiconductor components in the first set. The power manager can further comprise: means for utilizing the first voltage to perform storage operations with respect to storage cells in the first die; and means for utilizing the second voltage to perform storage operations with respect to storage cells in the second die.

In accordance with further embodiments, the power manager can include means for conveying the second voltage from the first die to a switch component disposed in the second die, and means for conveying a switch control signal to the switch component, the switch control signal controlling a state of the switch component.

In one embodiment, the power manager includes means for monitoring a magnitude of the first voltage; and means for controlling, based on the magnitude of the first voltage, switching of the current through the first inductive element to produce the first voltage within a desired voltage range.

In yet further embodiments, the power manager comprises: means for monitoring a magnitude of the second voltage; and means for controlling, based on the magnitude of the second voltage, switching of the current through the second inductive element to produce the second voltage within a desired voltage range.

Potential Advantages of Embodiments Herein

One embodiment herein supports the concept of having just one centralized power generation unit inside a assembly. This enables or at least eases efficient power management control, like voltage-frequency-scaling, light mode control, control of low power states, etc.

In accordance with another embodiment, power generation as discussed herein can be implemented on the most power and/or area efficient technology within heterogeneous multi-device systems without being limited with stringent maximum voltage ratings. The dedicated power management circuitry can be a separate device but also be a part inside a logic process. The latter embodiment benefits from having management control on the same die.

In accordance with another embodiment, the proposed concept supports the idea of decoupling power management from functional units inside heterogeneous stacks. Specific stacked devices will comprise just dedicated functionality (e.g. DRAM, non-volatile memories, RF, sensors), which always can be implemented in most appropriate process technology.

In accordance with another embodiment, the power management circuitry generates all required voltages internally in a multi-device system reduces the number of supply interconnects to the platform as well as number of devices on the platform. As mentioned, both yield area and cost advantages.

In accordance with such an embodiment, generation and distribution of higher voltages in a multi-device system reduces the number of supply bumps and interconnects (e.g. TSVs) within the system as it's determined by the amount of supply current, which reduces as voltage increases.

Any of the resources as discussed herein can include one or more computerized devices, computer systems, servers, base stations, wireless communication equipment, communication management systems, workstations, handheld or laptop computers, etc., to carry out and/or support any or all of the method operations disclosed herein. In other words, one or more computerized devices or processors can be programmed and/or configured to operate as explained herein to carry out different embodiments of the invention.

Yet other embodiments herein include software programs, firmware, logic, etc., to perform operations as disclosed herein. One such embodiment comprises a computer program product including a non-transitory computer-readable storage medium (i.e., any computer readable hardware storage medium) on which software instructions are encoded for subsequent execution. The instructions, when executed in a computerized device having one or more processors, program and/or cause the processor to perform the operations disclosed herein. Such arrangements can be provided as software, firmware, code, instructions, data (e.g., data structures), etc., arranged or encoded on a non-transitory computer readable storage medium such as an optical medium (e.g., CD-ROM), floppy disk, hard disk, memory, etc., or other a medium such as firmware or shortcode in one or more ROM, RAM, PROM, etc., or as logic in an Application Specific Integrated Die (ASIC), etc. The software or firmware or other such configurations can be installed onto a computerized device to cause the computerized device to perform the techniques explained herein.

Accordingly, embodiments herein are directed to an apparatus, a method, a system, a computer program product, etc., that supports operations as discussed herein.

Note that any of the processing as discussed herein can be performed in any suitable order.

It is to be understood that the apparatus, system, method, apparatus, instructions on computer readable storage media, etc., as discussed herein also can be embodied strictly as a software program, firmware, as a hybrid of software, hardware and/or firmware, or as hardware alone such as within a processor device, within an operating system or a within a software application, etc.

Additionally, note that although each of the different features, techniques, configurations, etc., herein may be discussed in different places of this disclosure, it is intended, where suitable, that each of the concepts can optionally be executed independently of each other or in combination with each other. Any permutation of the disclosed features is possible. Accordingly, the one or more embodiments as described herein can be embodied and viewed in many different ways.

Note further that techniques herein are well suited for use in systems including assemblies. However, it should be noted that embodiments herein are not limited to use in such applications and that the techniques discussed herein are well suited for other applications as well.

While details have been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the embodiments herein are presented in the following claims.

The invention claimed is:

1. An apparatus comprising:
a plurality of integrated circuit semiconductor dies in a common package;
power management circuitry on one of the plurality of dies to receive an input voltage for the common package, the power management circuitry including
a first inductive element;
a second inductive element magnetically coupled to the first inductive element; and
switching circuitry to control a current through the first inductive element to produce a first voltage different from the input voltage to power one of the plurality of integrated circuit semiconductor dies, and to induce a current through the second inductive element to produce a second voltage different from the first voltage to power another of the plurality of integrated circuit semiconductor dies.

2. The apparatus of claim 1, wherein the plurality of integrated circuit semiconductor dies comprises a vertical stack of dies.

3. The apparatus of claim 2, wherein the power management circuitry is to deliver the first and second voltages via one or more through-silicon vias (TSVs).

4. The apparatus of claim 1, wherein the plurality of integrated circuit semiconductor dies comprises semiconductor dies of different semiconductor technologies.

5. The apparatus of claim 1, wherein the plurality of integrated circuit semiconductor dies comprises multiple memory device dies.

6. The apparatus of claim 1, wherein the plurality of integrated circuit semiconductor dies comprises a base die and one or more memory device dies.

7. The apparatus of claim 1, wherein the plurality of integrated circuit semiconductor dies comprises one or more memory device dies and one or more non-memory device dies.

8. The apparatus of claim 1, wherein the power management circuitry comprises a voltage regulator with the inductive elements.

9. The apparatus of claim 7, wherein the first and second voltages comprise a first voltage different than the input voltage to power the memory device dies and a second voltage different from the first voltage to power the non-memory device dies.

10. The apparatus of claim 1, wherein the power management circuitry comprises a third inductive element magnetically coupled to the first inductive element to produce a third voltage different from the first and second voltages to power a different one of the plurality of integrated circuit semiconductor dies.

11. A multi-die package comprising:
a logic die to receive an input voltage for the multi-die package;

a vertical stack of a plurality of semiconductor dies on the logic die; and power management circuitry on the logic die to generate at least one voltage different from the input voltage of the plurality of semiconductor dies, the power management circuitry including a first inductive element;

a second inductive element magnetically coupled to the first inductive element; and switching circuitry to control a current through the first inductive element to produce a first voltage different from the input voltage to power one of the plurality of semiconductor dies, and to induce a current through the second inductive element to produce a second voltage different from the first voltage to power another of the semiconductor dies.

12. The package of claim 11, wherein the power management circuitry is to deliver the first and second voltages via one or more through-silicon vias (TSVs).

13. The package of claim 11, wherein the plurality of semiconductor dies comprises multiple memory chips.

14. The package of claim 13, wherein the multiple memory chips comprises at least one non-volatile memory chip.

15. The package of claim 13, wherein the multiple memory chips comprises at least one volatile memory chip.

16. The package of claim 11, wherein the plurality of semiconductor dies comprises one or more memory device dies and one or more non-memory device dies.

17. The package of claim 11, wherein the power management circuitry comprises a voltage regulator with the inductive elements.

18. The package of claim 16, wherein the first and second voltages comprise a first voltage different than the input voltage to power the memory device dies and a second voltage different from the first voltage to power the non-memory device dies.

19. The package of claim 11, wherein the power management circuitry comprises a third inductive element magnetically coupled to the first inductive element to produce a third voltage different from the first and second voltages to power a different one of the plurality of semiconductor dies.

* * * * *